(12) United States Patent
Sung et al.

(10) Patent No.: US 10,333,029 B2
(45) Date of Patent: Jun. 25, 2019

(54) LIGHT-EMITTING ELEMENT

(71) Applicant: LG INNOTEK CO., LTD., Seoul (KR)

(72) Inventors: Youn Joon Sung, Seoul (KR); Ji Hyung Moon, Seoul (KR); Su Ik Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 24 days.

(21) Appl. No.: 15/575,242

(22) PCT Filed: Apr. 22, 2016

(86) PCT No.: PCT/KR2016/004245
§ 371 (c)(1),
(2) Date: Nov. 17, 2017

(87) PCT Pub. No.: WO2016/186330
PCT Pub. Date: Nov. 24, 2016

(65) Prior Publication Data
US 2018/0138366 A1 May 17, 2018

(30) Foreign Application Priority Data
May 19, 2015 (KR) ........................ 10-2015-0069775

(51) Int. Cl.
*H01L 33/38* (2010.01)
*H01L 33/62* (2010.01)
(Continued)

(52) U.S. Cl.
CPC .......... *H01L 33/385* (2013.01); *H01L 33/382* (2013.01); *H01L 33/387* (2013.01);
(Continued)

(58) Field of Classification Search
CPC ......... H01L 33/24; H01L 33/62; H01L 33/56; H01L 27/156
See application file for complete search history.

(56) References Cited

U.S. PATENT DOCUMENTS

2013/0228744 A1* 9/2013 Kazama ............... H01L 33/382
257/13
2014/0209952 A1* 7/2014 Ye ......................... H01L 33/20
257/98

(Continued)

FOREIGN PATENT DOCUMENTS

JP 11-150298 A 6/1999
JP 2013-201411 A 10/2013
(Continued)

*Primary Examiner* — Fernando L Toledo
*Assistant Examiner* — Valerie N Newton
(74) *Attorney, Agent, or Firm* — Birch, Stewart, Kolasch & Birch, LLP

(57) ABSTRACT

An embodiment relates to a light-emitting element capable of reducing the driving voltage and improving the optical output, comprising: a support substrate; a light-emitting structure which is arranged on the support substrate, and which comprises a first semiconductor layer, an active layer, and a second semiconductor layer; a plurality of connection grooves comprising bottom surfaces, which expose the second semiconductor layer through removal of the light-emitting structure, and side surfaces, which expose the first semiconductor layer, the active layer, and the second semiconductor layer; a first electrode arranged on the light-emitting structure so as to contact the first semiconductor layer, the first electrode comprising a first electrode pattern, which has ends extending to the peripheries of the connection grooves, and a second electrode pattern, which is arranged on the first electrode pattern; a contact electrode extending to the upper surface of the first semiconductor layer so as to surround the bottom and side surfaces of the connection grooves; a second electrode comprising a bonding electrode connected to a plurality of the contact electrodes; and an insulating pattern arranged between the first electrode and the second electrode.

18 Claims, 13 Drawing Sheets

(51) Int. Cl.
    *H01L 33/06*     (2010.01)
    *H01L 33/32*     (2010.01)
    *H01L 33/40*     (2010.01)
    *H01L 33/44*     (2010.01)
    *H01L 33/22*     (2010.01)

(52) U.S. Cl.
    CPC .............. *H01L 33/62* (2013.01); *H01L 33/06* (2013.01); *H01L 33/22* (2013.01); *H01L 33/32* (2013.01); *H01L 33/405* (2013.01); *H01L 33/44* (2013.01); *H01L 2224/48091* (2013.01); *H01L 2933/0016* (2013.01)

(56) References Cited

U.S. PATENT DOCUMENTS

| | | | |
|---|---|---|---|
| 2016/0087149 A1 | 3/2016 | Miyachi et al. | |
| 2016/0093769 A1 | 3/2016 | Vom Dorp et al. | |
| 2016/0372636 A1* | 12/2016 | Hwang | H01L 33/46 |

FOREIGN PATENT DOCUMENTS

| | | |
|---|---|---|
| KR | 10-2011-0136111 A | 12/2011 |
| WO | WO 2014/192237 A1 | 12/2014 |
| WO | WO 2014/195420 A1 | 12/2014 |

\* cited by examiner

[FIG 1a]
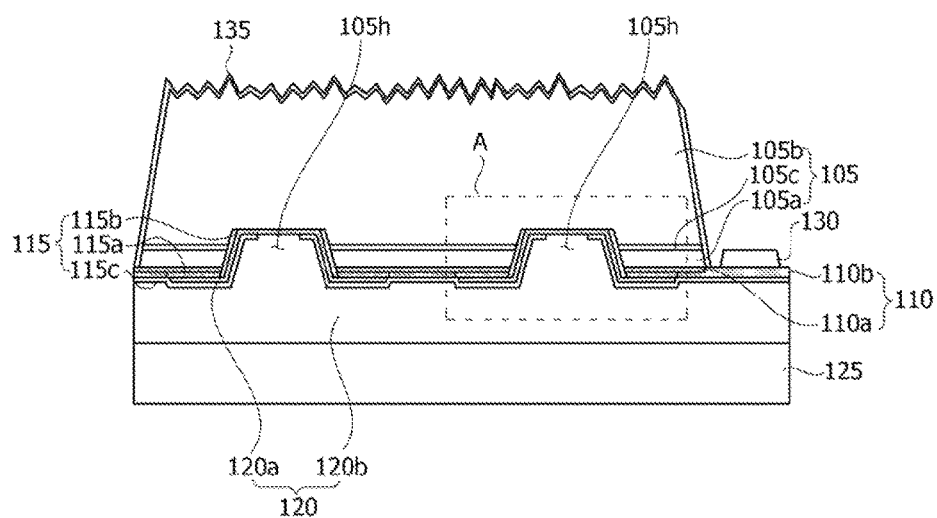
[FIG 1b]
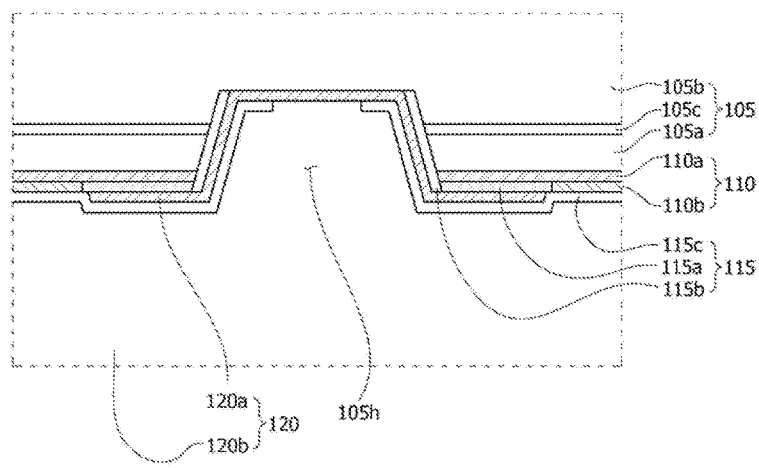

[FIG 2]
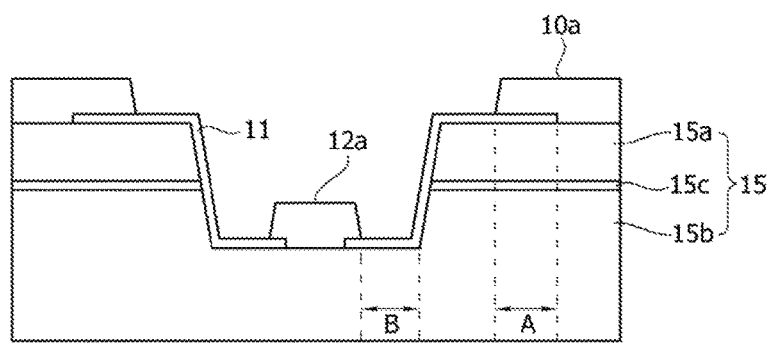
[FIG 3a]
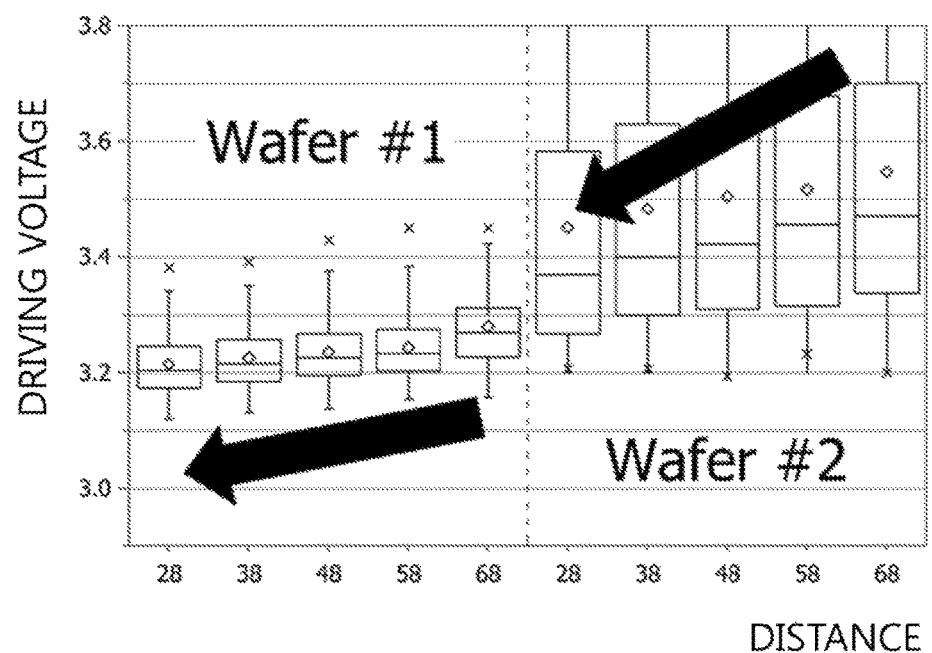

[FIG 3b]
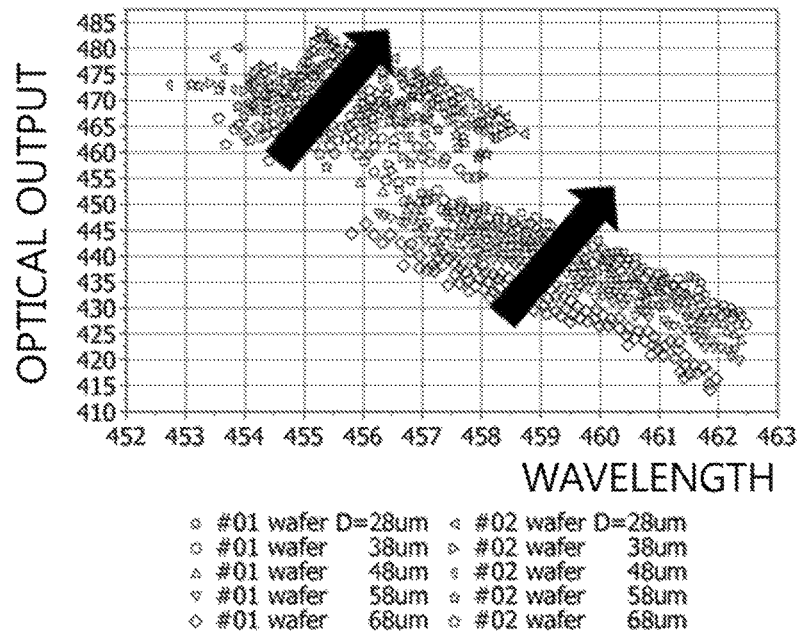
[FIG 4a]
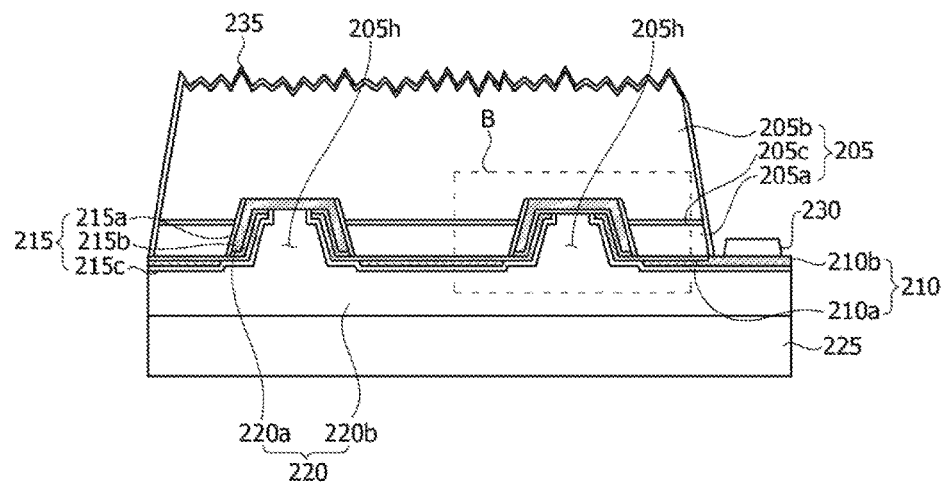

[FIG 4b]
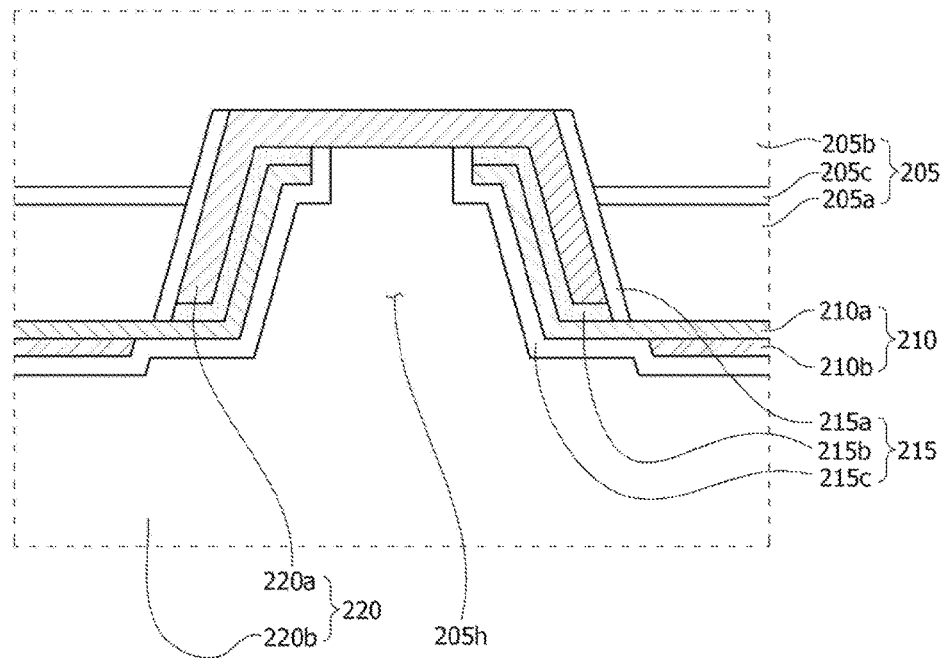
[FIG 5a]
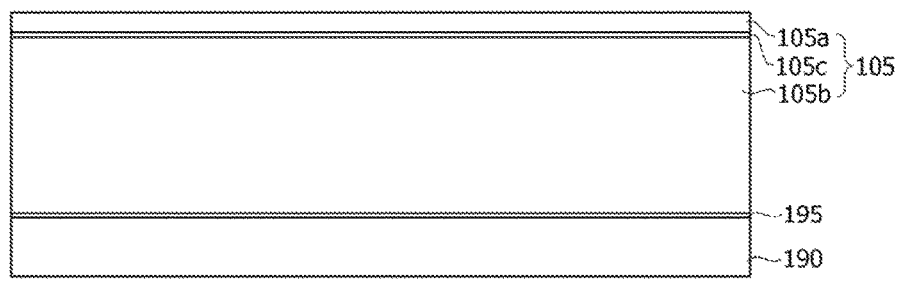

[FIG 5b]
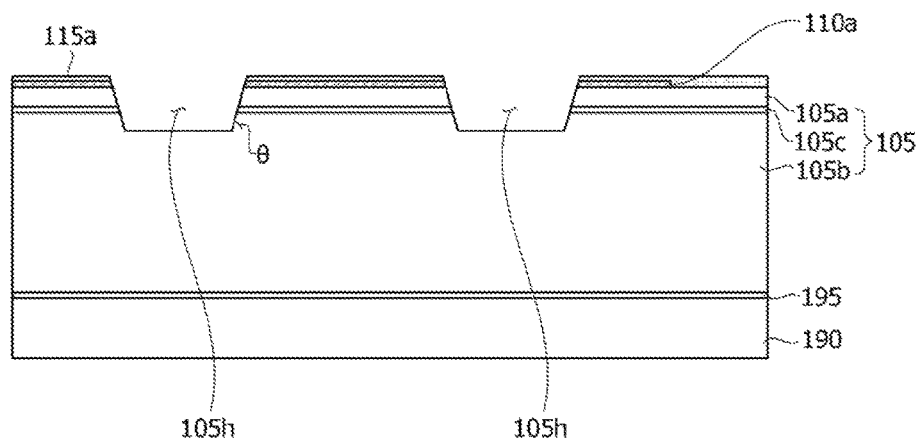
[FIG 5c]
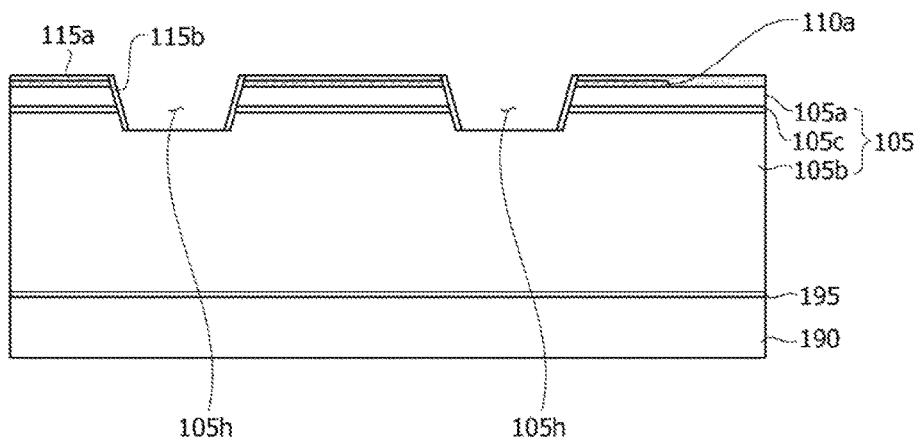

[FIG 5d]
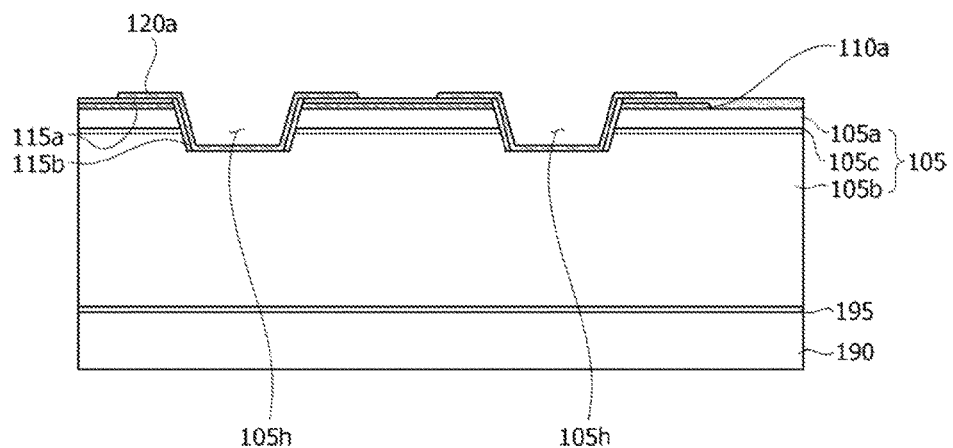
[FIG 5e]
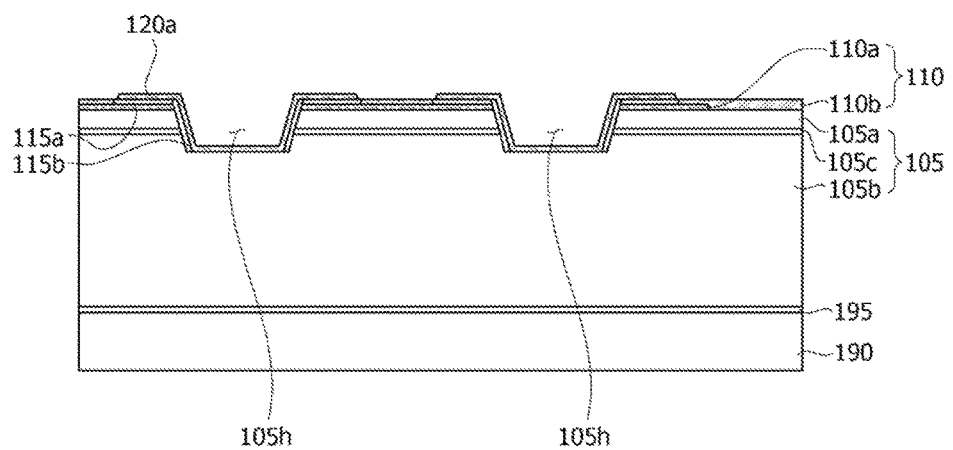

[FIG 5f]
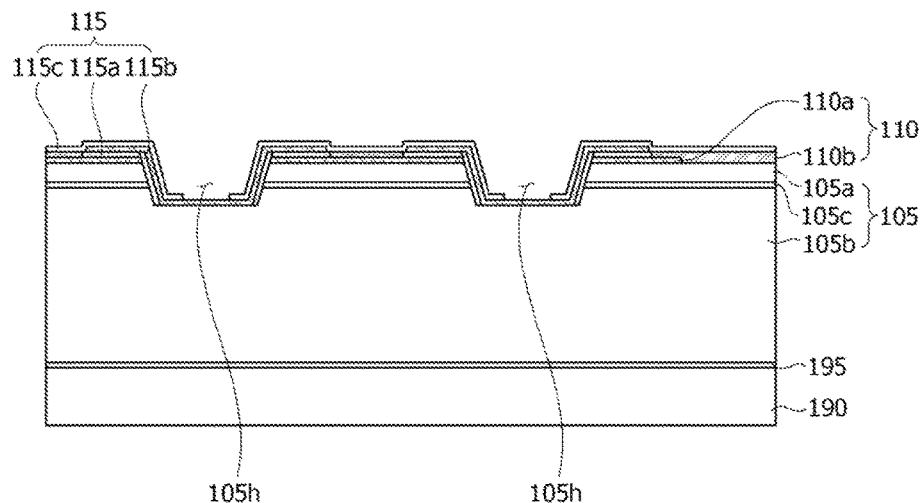
[FIG 5g]
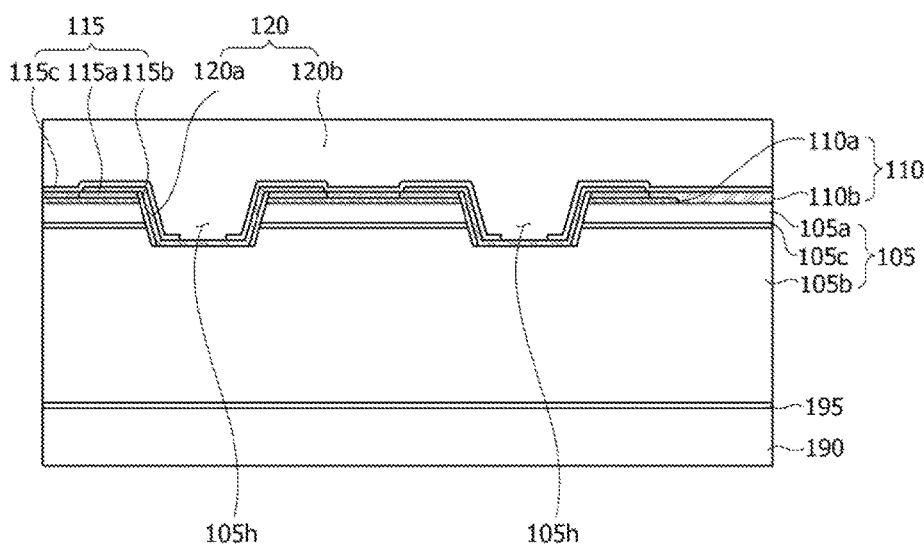

[FIG 5h]
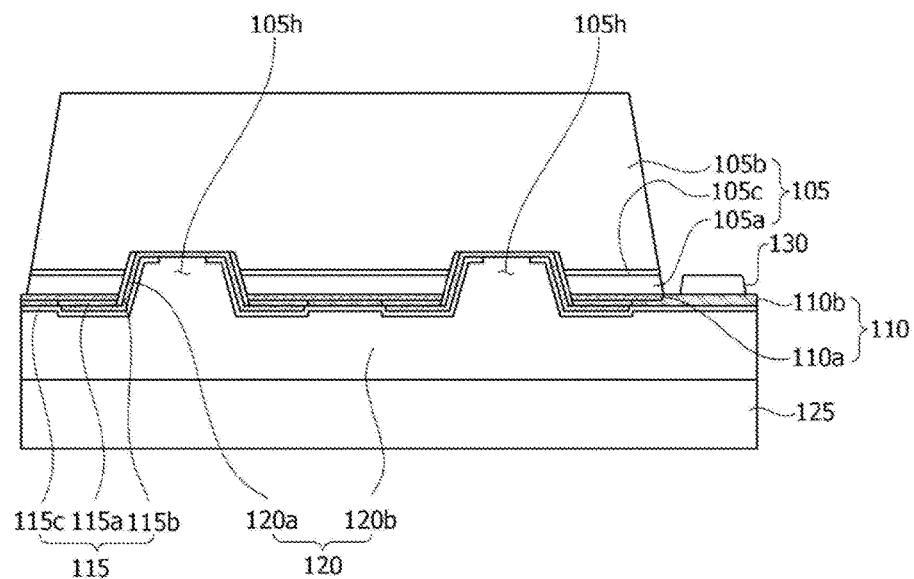
[FIG 5i]
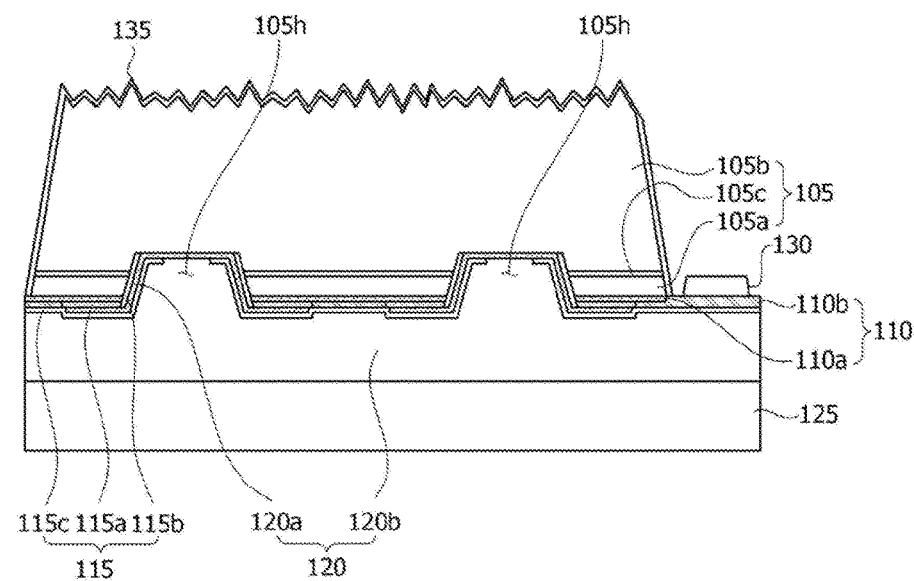

[FIG 6a]
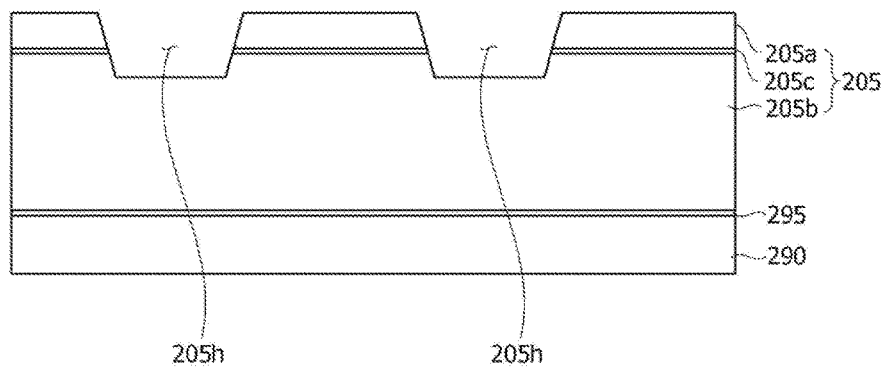
[FIG 6b]
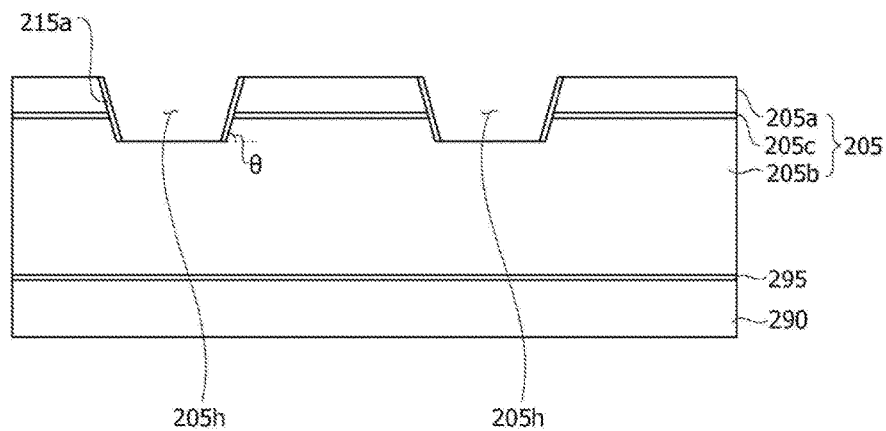

[FIG 6c]
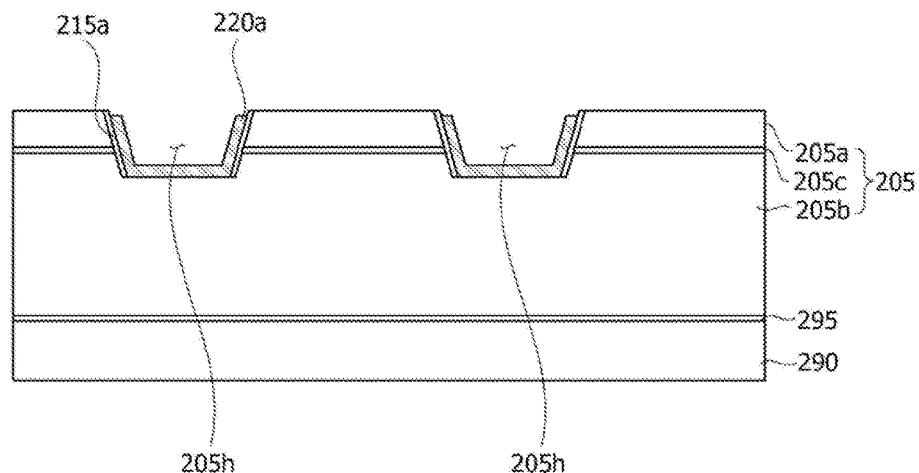
[FIG 6d]
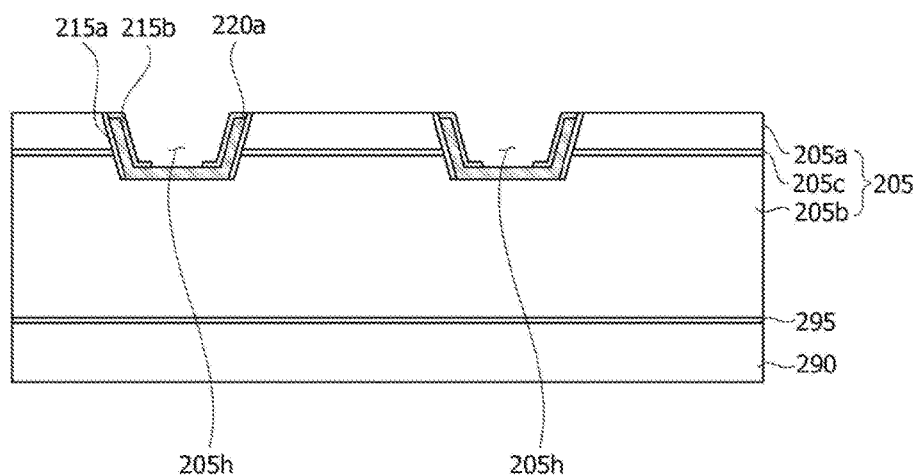

[FIG 6e]
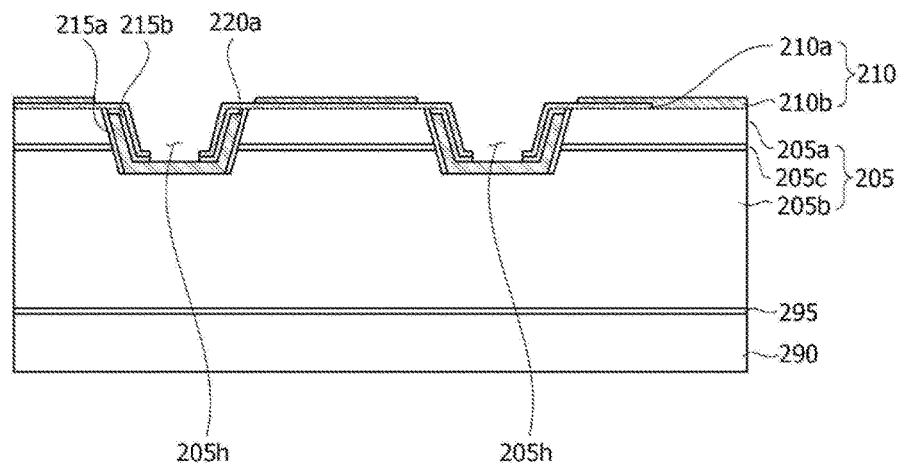
[FIG 6f]
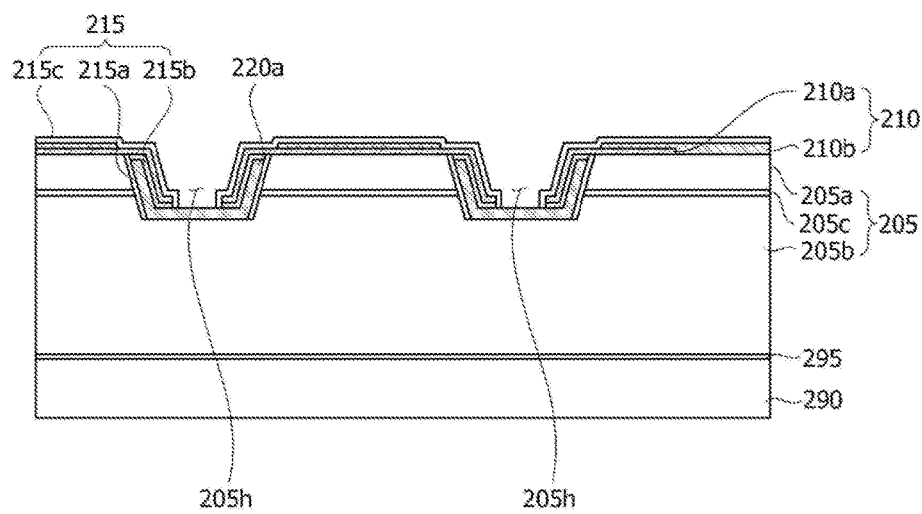

[FIG 6g]
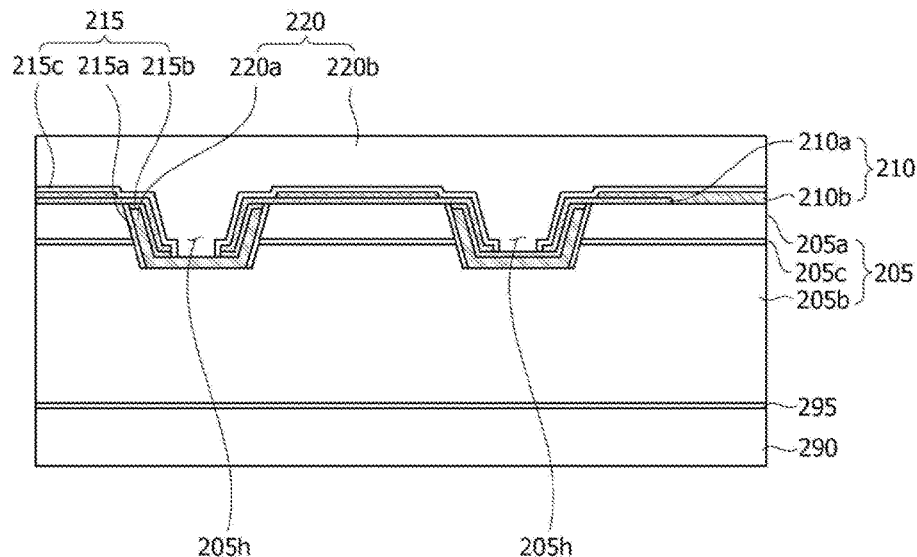
[FIG 6h]
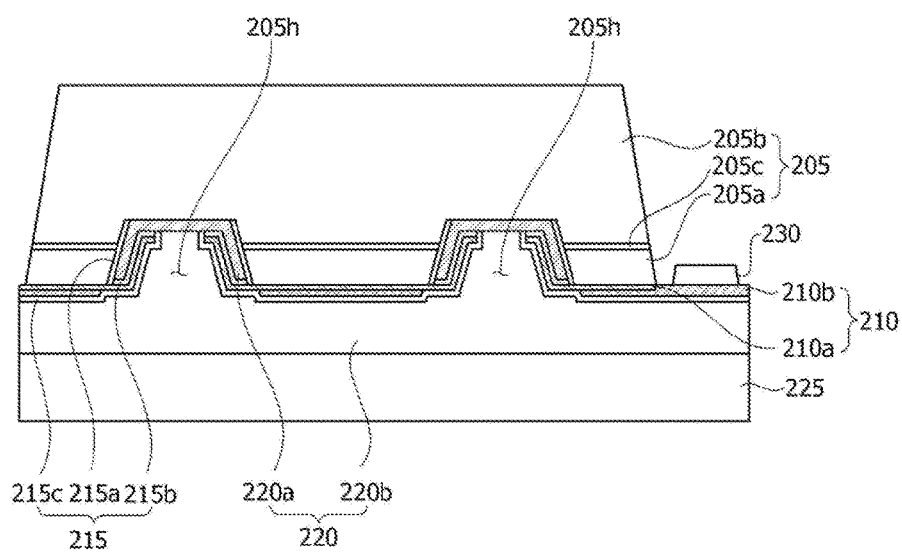

[FIG 6i]
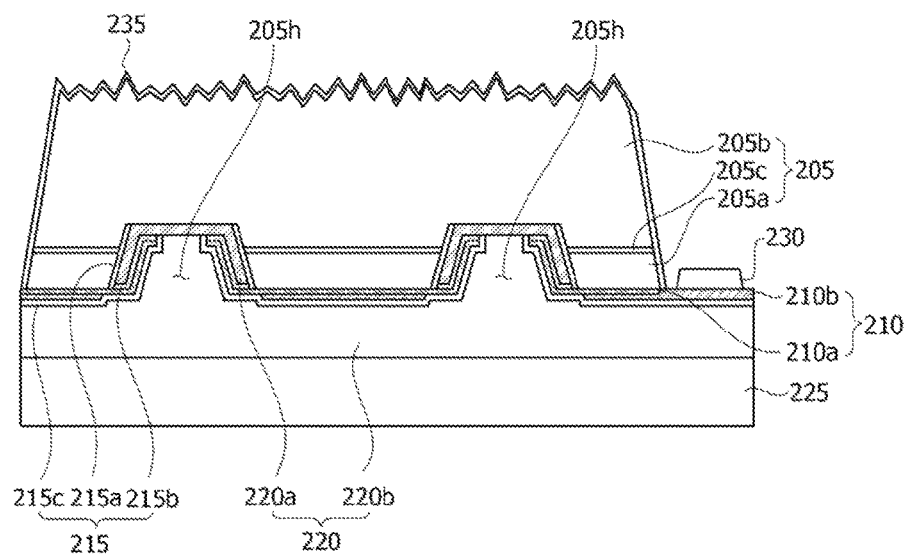
[FIG 7]
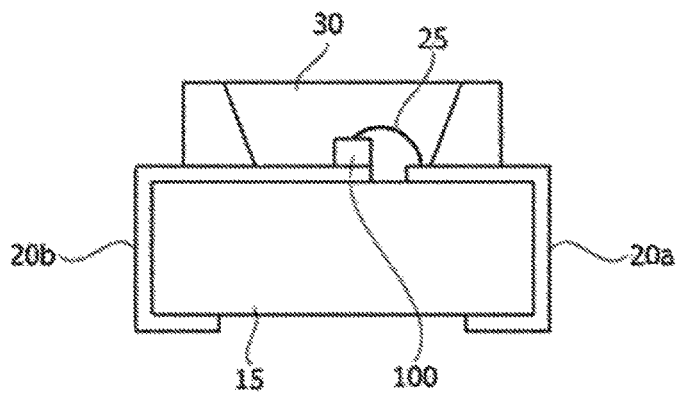

LIGHT-EMITTING ELEMENT

CROSS REFERENCE TO RELATED APPLICATIONS

This application is the National Phase of PCT International Application No. PCT/KR2016/004245, filed on Apr. 22, 2016, which claims priority under 35 U.S.C. 119(a) to Patent Application No. 10-2015-0069775, filed in the Republic of Korea on May 19, 2015, all of which are hereby expressly incorporated by reference into the present application.

TECHNICAL FIELD

Embodiments of the present disclosure relate to a light-emitting element.

BACKGROUND ART

A light emitting diode (LED) is one of light-emitting elements that emit light when a current is applied thereto. The light emitting diode may operate at a low voltage to emit light with high efficiency so that an energy saving effect thereof is outstanding. Recently, a luminance problem of the light emitting diode is significantly improved, and thus the light emitting diode is applied to various devices such as a backlight unit of a liquid crystal display device, an electronic sign board, an indicator, a home appliance, and the like.

A light-emitting element includes a light-emitting structure including a first semiconductor layer, an active layer, and a second semiconductor layer which are arranged on a support substrate, and includes a first electrode and a second electrode which are connected to the light-emitting structure. In the light-emitting element, electrons or holes injected through the first electrode and holes or electrons injected through the second electrode are moved due to a difference in voltage between the first electrode and the second electrode, and recombined to emit light in the active layer.

Meanwhile, a vertical type light-emitting element, in which a second electrode is formed to be electrically connected to a second semiconductor layer inside a connection groove formed in a light-emitting structure and the second electrode and a first semiconductor layer are insulated through an insulating pattern, has a structure in which a distal end of the first electrode and a distal end of the second electrode are spaced apart from each other. However, as a distance between the first electrode and the second electrode increases, there occurs a problem in that a driving voltage of the light-emitting element is increased and an optical output is decreased.

DISCLOSURE

Technical Problem

Embodiments of the present disclosure provide a light-emitting element capable of reducing a driving voltage and improving an optical output.

Technical Solution

A light-emitting element according to an embodiment of the present disclosure includes a support substrate; a light-emitting structure disposed on the support substrate and including a first semiconductor layer, an active layer, and a second semiconductor layer; a plurality of connection grooves which each include a bottom surface exposing the second semiconductor layer and a side surface exposing the first semiconductor layer, the active layer, and the second semiconductor layer by the light-emitting structure being removed; a first electrode disposed on the light-emitting structure to be in contact with the first semiconductor layer, and including a first electrode pattern having a distal end extending to an edge of each of the plurality of connection grooves, and a second electrode pattern disposed on the first electrode pattern; a second electrode including a contact electrode extending to an upper surface of the first semiconductor layer to surround the bottom surface and the side surface of each of the plurality of connection grooves, and a bonding electrode connected to a plurality of the contact electrodes; and an insulating pattern disposed between the first electrode and the second electrode.

A light-emitting element according to another embodiment of the present disclosure includes a support substrate; a light-emitting structure disposed on the support substrate and including a first semiconductor layer, an active layer, and a second semiconductor layer; a plurality of connection grooves which each include a bottom surface exposing the second semiconductor layer and a side surface exposing the first semiconductor layer, the active layer, and the second semiconductor layer by the light-emitting structure being removed; a first electrode electrically connected to the first semiconductor layer and including a first electrode pattern extending to an inside of each of the plurality of connection grooves, and a second electrode pattern disposed on the first electrode pattern; a second electrode including a contact electrode extending to an edge of each of the plurality of connection grooves to surround the bottom surface and the side surface of each of the plurality of connection grooves, and a bonding electrode connected to a plurality of the contact electrodes; and an insulating pattern disposed between the first electrode and the second electrode.

Advantageous Effects

In accordance with the embodiments, the light-emitting element according to the embodiments of the present disclosure has the following effects.

First, a first electrode pattern of a first electrode, which is formed on an upper surface of a first semiconductor layer to come into direct contact with the first semiconductor layer, is formed up to an edge of a connection groove. That is, an overlapped area between the first electrode pattern serving as a reflective layer and an active layer expands to improve reflection efficiency such that an optical output can be increased.

Second, a contact electrode of a second electrode, which is in direct contact with a second semiconductor layer through the connection groove, is entirely formed on an inner surface of the connection groove. Therefore, a contact area between the contact electrode and the second semiconductor layer expands such that a driving voltage can be reduced.

Third, the first electrode pattern of the first electrode, which is in direct contact with the first semiconductor layer, and the contact electrode of the second electrode, which is in direct contact with the second semiconductor layer, are overlapped by interposing an insulating pattern between the first electrode pattern and the contact electrode. Therefore, a distance between a distal end of the first electrode and a distal end of the second electrode becomes zero such that resistance of the light-emitting element can be reduced, and the driving voltage of the light-emitting element can also be reduced.

DESCRIPTION OF DRAWINGS

FIG. 1A is a cross-sectional view of a light-emitting element according to an embodiment of the present disclosure.

FIG. 1B is an enlarged diagram of Area A in FIG. 1A.

FIG. 2 is a cross-sectional view of a typical light-emitting element.

FIG. 3A is a graph illustrating a driving voltage according to a distance between a first electrode and a second electrode.

FIG. 3B is a graph illustrating an optical output according to the distance between the first electrode and the second electrode.

FIG. 4A is a cross-sectional view of a light-emitting element according to another embodiment of the present disclosure.

FIG. 4B is an enlarged diagram of Area B in FIG. 4A.

FIGS. 5A to 5I are cross-sectional views illustrating processes of a manufacturing method of the light-emitting element according to the embodiment of the present disclosure.

FIGS. 6A to 6I are cross-sectional views illustrating processes of a manufacturing method of the light-emitting element according to another embodiment of the present disclosure.

FIG. 7 is a cross-sectional view of a light-emitting element package including the light-emitting element according to the embodiment of the present disclosure.

MODES OF THE INVENTION

The present disclosure may be modified in various forms and may have a variety of embodiments, and, therefore, specific embodiments will be illustrated in the drawings. The embodiments, however, are not to be taken in a sense for limiting the present disclosure to the specific embodiments, and should be construed to include modifications, equivalents, or substitutions within the spirit and technical scope of the present disclosure.

Also, the terms including ordinal numbers such as "first," "second," and the like used herein can be used to describe various components, but the components are not limited by these terms. The terms are used only for the purpose of distinguishing one component from another component. For example, without departing from the scope of the present disclosure, a first component may be referred to as a second component, and similarly, the second component may also be referred to as the first component. The term "and/or" includes a combination of a plurality of related listed items or any one item of the plurality of related listed items.

When a component is referred to as being "connected," or "coupled" to other component, it may be directly connected or coupled to the other component, but it should be understood that another component may exist between the component and the other component. Contrarily, when a component is referred to as being "directly connected," or "directly coupled" to other component, it should be understood that another component may be absent between the component and the other component.

The terms used herein are employed to describe only specific embodiments and are not intended to limit the present disclosure. Unless the context clearly dictates otherwise, the singular form includes the plural form. It should be understood that the terms of "comprise" and "have" specify the presence of stated herein features, numbers, steps, operations, elements, components, or a combination thereof, but do not preclude the presence or probability of addition of one or more another features, numbers, steps, operations, elements, components, or a combination thereof.

In the description of the embodiments, when an element is described as being formed "on or under" another element, over (upper) or below (lower), or on or under entirely involves that two components are in direct contact with each other or one or more other components are indirectly formed between the two components. Also, when described as "over, upper, below, lower, on, or under", it may include not only an upward direction but also a downward direction on the basis of one component.

Hereinafter, embodiments of the present disclosure will be described in detail with reference to the drawings, the same reference numerals are given to the same or corresponding components regardless of reference numerals, and a repetitive description thereof will be omitted.

Hereinafter, a light-emitting element according to an embodiment will be described in detail below with reference to the accompanying drawings.

FIG. 1A is a cross-sectional view of a light-emitting element according to an embodiment of the present disclosure, and FIG. 1B is an enlarged diagram of Area A in FIG. 1A.

Referring to FIGS. 1A and 1B, the light-emitting element according to the embodiment of the present disclosure includes a light-emitting structure 105 arranged on a support substrate 125 and including a first semiconductor layer 105a, an active layer 105c, and a second semiconductor layer 105b; a first electrode 110 electrically connected to the first semiconductor layer 105a, a second electrode 120 electrically connected to the second semiconductor layer 105b, and an insulating pattern 115 configured to insulate the first electrode 110 from the second electrode 120. At this point, a first electrode pattern 110a of the first electrode 110, which is in direct contact with the first semiconductor layer 105a, and a contact electrode 120a of the second electrode 120, which is in direct contact with the second semiconductor layer 105b, are overlapped at a lower surface of the first semiconductor layer 105a by interposing the insulating pattern 115 between the first electrode pattern 110a and the contact electrode 120a.

The first semiconductor layer 105a may be implemented with a group III-V or II-VI compound semiconductor, and may be doped with a first dopant. The first semiconductor layer 105a may be formed of a semiconductor material having a composition formula of InxAlyGa1-x-yN (0=x=1, 0=y=1, and 0=x+y=1), or a material selected from AlInN, AlGaAs, GaP, GaAs, GaAsP, and AlGaInP. When the first dopant is a p-type dopant such as Mg, Zn, Ca, Sr, or Ba, the first semiconductor layer 105a doped with the first dopant may be a p-type semiconductor layer.

When the light-emitting element according to the embodiment of the present disclosure is an ultraviolet (UV) light-emitting element, a deep UV light-emitting element, or an unpolarized light-emitting element, the first semiconductor layer 105a may include at least one of InAlGaN and AlGaN. When the first semiconductor layer 105a is a p-type semiconductor layer, the first semiconductor layer 105a may include graded AlGaN having a gradient of aluminum concentration to reduce a lattice difference. The first semiconductor layer 105a may have a single-layered structure or a multilayered structure, and the first semiconductor layer 105a is shown as having a single-layered structure in the drawings.

The active layer 105c is arranged between the first semiconductor layer 105a and the second semiconductor layer 105b. The active layer 105c is a layer in which electrons (or holes) injected through the first semiconductor layer 105a and holes (or electrons) injected through the second semiconductor layer 105b are recombined. The active layer 105c may be transited to a low energy level due to a recombination of electrons and holes to emit light having a wavelength corresponding to the transition.

The active layer 105c may have any one of a single well structure, a multiple well structure, a single quantum well structure, a multi quantum well (MQW) structure, a quantum dot structure, and a quantum wire structure, but a structure of the active layer 105c is not limited thereto.

When the active layer 105c is formed of a well structure, a well layer/barrier layer of the active layer 105c may be formed of one or more pair structures of InGaN/GaN, InGaN/InGaN, GaN/AlGaN, InAlGaN/GaN, GaAs(InGaAs)/AlGaAs, and GaP(InGaP)/AlGaP, but the present disclosure is not limited thereto. The well layer may be formed of a material having a bandgap that is smaller than that of the barrier layer.

The second semiconductor layer 105b may be implemented with a group III-V or II-VI compound semiconductor, and may be doped with a second dopant. The second semiconductor layer 105b may be formed of a semiconductor material having a composition formula of $Al_xIn_yGa_{(1-x-y)}N$ ($0 \leq x \leq 1$, $0 \leq y \leq 1$, and $0 \leq x+y \leq 1$), or one or more among InAlGaN, AlGaAs, GaP, GaAs, GaAsP, and AlGaInP, but the second semiconductor layer 105b is not limited thereto. When the second dopant is an n-type dopant such as Si, Ge, Sn, Se, or Te, the second semiconductor layer 105b doped with the second dopant may be an n-type semiconductor layer.

When the light-emitting element according to the embodiment of the present disclosure is an ultraviolet (UV) light-emitting element, a deep UV light-emitting element, or an unpolarized light-emitting element, the second semiconductor layer 105b may include at least one of InAlGaN and AlGaN. When the second semiconductor layer 105b is made of AlGaN, a content of Al may be 50%. Also, when the second semiconductor layer 105b is an n-type semiconductor layer, the second semiconductor layer 105b may be made of Al0.5GaN.

Although the second semiconductor layer 105b is shown as having a single layered structure in the drawings, the second semiconductor layer 105b may have a multilayered structure. When the second semiconductor layer 105b has a multilayered structure, the second semiconductor layer 105b may further include an undoped semiconductor layer (not shown). The undoped semiconductor layer is a layer that is formed to improve crystallizability of the second semiconductor layer 105b, and the undoped semiconductor layer may have electrical conductivity that is lower than that of the second semiconductor layer 105b since the undoped semiconductor layer is not doped with the second dopant.

The light-emitting structure 105 according to the embodiment of the present disclosure may be configured to include the first semiconductor layer 105a that is a p-type semiconductor layer and the second semiconductor layer 105b that is an n-type semiconductor layer, or the first semiconductor layer 105a that is an n-type semiconductor layer and the second semiconductor layer 105b that is a p-type semiconductor layer. In addition, the light-emitting structure 105 may have a structure in which an n-type or p-type semiconductor layer is further formed between the second semiconductor layer 105b and the active layer 105c. That is, the light-emitting structure 105 according to the embodiment of the present disclosure may be formed with at least one of np, pn, npn, and pnp junction structures, and thus the light-emitting structure 105 according to the embodiment of the present disclosure may have various structures including an n-type semiconductor layer and a p-type semiconductor layer. Further, a doping concentration of impurities in each of the first semiconductor layer 105a and the second semiconductor layer 105b may be uniform or non-uniform. That is, a doping profile of the light-emitting structure 105 may be variously formed, and the doping profile is not limited to the described above.

A protective layer 135 may be formed to surround the light-emitting structure 105. The protective layer 135 may be made of a non-conductive oxide or nitride. For example, the protective layer 135 may be formed of at least one selected from the group consisting of $SiO_2$, $Si_xO_y$, $Si_3N_4$, $Si_xN_y$, $SiO_xN_y$, $Al_2O_3$, $TiO_2$, AlN, and the like, but is not limited thereto. In addition, since an upper surface of the second semiconductor layer 105b has a roughness pattern, the protective layer 135 may also be formed along the roughness pattern. At this point, as shown in the drawing, the roughness pattern may be a nonuniform pattern or a uniform pattern.

The first electrode 110 is electrically connected to the first semiconductor layer 105a, and the second electrode 120 is electrically connected to the second semiconductor layer 105b. At this point, the second electrode 120 is connected to the second semiconductor layer 105b through a plurality of connection grooves 105h which selectively removes the first semiconductor layer 105a, the active layer 105c, and the second semiconductor layer 105b to expose the second semiconductor layer 105b.

Specifically, the first electrode 110 may be formed between the light-emitting structure 105 and the support substrate 125 to be overlapped with the first semiconductor layer 105a. The first electrode 110 includes the first electrode pattern 110a in direct contact with the first semiconductor layer 105a, and a second electrode pattern 110b arranged underneath the first electrode pattern 110a to surround the first electrode pattern 110a.

The first electrode pattern 110a may serve as a reflective layer configured to reflect light generated in the active layer 105c in a direction of the second semiconductor layer 105b. For this, the first electrode pattern 110a may be formed of a material having high reflectance such as Ag, Ni, Al, Rh, Pd, Ir, Ru, Mg, Zn, Pt, Au, Hf, and the like, or a mixture of the material having high reflectance and a transparent conductive material such as IZO, IZTO, IAZO, IGZO, IGTO, AZO, ATO, and the like.

The first electrode pattern 110a is arranged underneath the light-emitting structure 105 to come into direct contact with the first semiconductor layer 105a, and a distal end of the first electrode pattern 110a extends to an edge of the connection groove 105h. That is, the distal end of the first electrode pattern 110a coincides with the edge of the connection groove 105h. At this point, the first electrode pattern 110a serves as a reflective layer. Consequently, in the light-emitting element according to the embodiment of the present disclosure, the first electrode pattern 110a is formed on an entire surface of the first semiconductor layer 105a except for the connection grooves 105h, so that an overlapped area between the first electrode pattern 110a and the active layer 105c expands. That is, reflection efficiency of the light generated in the active layer 105c is increased to improve an optical output of the light-emitting element.

The second electrode pattern 110b may be formed of a material having superior electrical conductivity so as to allow a current injected from the outside to horizontally uniformly flow. The second electrode pattern 110b may be formed of a transparent conductive oxide (TCO) film. The TCO film may be formed of a material selected from among indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), IGTO (Indium Gallium Tin Oxide), ATO (Antimony Tin Oxide), Gallium Zinc Oxide (GZO), IZO Nitride (IZON), ZnO, IrOx, RuOx, NiO, and the like.

Also, the second electrode pattern 110b may be formed of an opaque metal such as Ag, Ni, Al, Rh, Pd, Ir, Ru, Mg, Zn, Pt, Au, Hf, or the like. In addition, the second electrode pattern 110b may be formed with a single layer or a plurality of layers in which the TCO film and the opaque metal are mixed, but is not limited thereto.

The second electrode 120 electrically connected to the second semiconductor layer 105b is arranged between the light-emitting structure 105 and the support substrate 125. As described above, the second electrode 120 is connected to the second semiconductor layer 105b through the plurality of connection grooves 105h. At this point, each of the plurality of connection grooves 105h includes a bottom surface exposing the second semiconductor layer 105b, and a side surface exposing the first semiconductor layer 105a, the active layer 105c, and the second semiconductor layer 105b.

The second electrode 120 includes the contact electrode 120a in contact with the second semiconductor layer 105b in the connection groove 105h, and a bonding electrode 120b configured to connect the contact electrodes 120a. The contact electrode 120a is arranged to the lower surface of the first semiconductor layer 105a to completely surround the bottom surface and the side surface of the connection groove 105h. That is, since the contact electrode 120a is entirely disposed on the side surface inside the connection groove 105h, a contact area between the contact electrode 120a and the second semiconductor layer 105b expands. Consequently, a driving voltage of the light-emitting element is reduced.

Although the bonding electrode 120b is shown as being a single layer in the drawing, the bonding electrode 120b may be formed with a single layer or a plurality of layers in which the TCO film and the opaque metal are mixed, but is not limited thereto.

Further, the insulating pattern 115 may be disposed between the first electrode 110 and the second electrode 120 to electrically insulate the first electrode 110 from the second electrode 120. The insulating pattern 115 may include first, second, and third insulating patterns 115a, 115b, and 115c.

The first insulating pattern 115a insulates the contact electrode 120a from the first electrode pattern 110a below the first semiconductor layer 105a. Accordingly, the contact electrode 120a and the first electrode pattern 110a are overlapped with each other on the lower surface of the first semiconductor layer 105a around the connection groove 105h by interposing the first insulating pattern 115a between the contact electrode 120a and the first electrode pattern 110a. At this point, the first electrode pattern 110a and a distal end of the first insulating pattern 115a coincide with each other at the edge of the connection groove 105h. Further, the second insulating pattern 115b is disposed on the side surface of the connection groove 105h, and specifically, the second insulating pattern 115b is disposed between the contact electrode 120a and the side surface of the connection groove 105h. The second insulating pattern 115b insulates a distal end of the contact electrode 120a extending to the edge of the connection groove 105h from the contact electrode 120a. Also, the contact electrode 120a and the active layer 105c, and the contact electrode 120a and the first semiconductor layer 105a may be insulated from each other through the second insulating pattern 115b on the side surface of the connection groove 105h.

Further, the third insulating pattern 115c is disposed below the light-emitting structure 105 to insulate the bonding electrode 120b from the second electrode pattern 110b. Specifically, the third insulating pattern 115c may be entirely disposed on a lower surface of the first electrode 110 so as to expose the contact electrode 120a inside the connection groove 105h, and the contact electrode 120a and the bonding electrode 120b may be electrically connected inside the connection groove 105h.

The first, second, and third insulating patterns 115a, 115b, and 115c may be respectively formed of at least one selected from the group consisting of SiO2, SixOy, Si3N4, SixNy, SiOxNy, Al2O3, TiO2, AlN, and the like, but they are not limited thereto.

Although not shown in the drawing, the second electrode 120 may be electrically connected to the support substrate 125 through a bonding layer (not shown). The bonding layer may be formed of a metal, such as Au, Sn, In, Ag, Ni, Nb, Cu, or the like, or an alloy thereof, but is not limited thereto. Also, the support substrate 125 and the second electrode 120 may be bonded, welding-bonded, or diffusion-bonded by the bonding layer. At this point, the bonding layer may be formed of a material having electrical conductivity in a solid state, but is not limited thereto.

Accordingly, the support substrate 125 may support the light-emitting structure 105 and, simultaneously, may be electrically connected to the second electrode 120, thereby serving as an electrode pad of the second electrode 120. Further, an electrode pad 130 may be formed on an upper surface of the first electrode 110, which is exposed by the protective layer 135. The electrode pad 130 is electrically connected to the first electrode 110.

The light-emitting element according to the embodiment of the present disclosure is configured such that the first electrode pattern 110a of the first electrode 110, which is in contact with the first semiconductor layer 105a, and the contact electrode 120a of the second electrode 120, which is in contact with the second semiconductor layer 105b, are overlapped by interposing the insulating pattern 115 between the first electrode pattern 110a and the contact electrode 120a. Accordingly, a distance between a distal end of the first electrode 110 and a distal end of the second electrode 120 becomes zero, and resistance of the light-emitting element is decreased such that the driving voltage of the light-emitting element is reduced.

On the other hand, in a typical light-emitting element, a distal end of a first electrode and a distal end of a second electrode are spaced away from each other by at least 20 μm or more due to a process margin of the first electrode, an insulating pattern, and the second electrode.

FIG. 2 is a cross-sectional view of a typical light-emitting element, and illustrates a portion of the typical light-emitting element including a connection groove.

As shown in FIG. 2, in the typical light-emitting element, a first electrode 10a is electrically connected to a first semiconductor layer 15a at an upper portion of a light-emitting structure 15, and a second electrode 12a is electrically connected to a second semiconductor layer 15b inside the connection groove. Further, an insulating pattern 11 may be disposed on a side surface of the connection groove to insulate the second electrode 12a from the first semiconductor layer 15a.

In the typical light-emitting element, however, a process for forming the insulating pattern 11 to expose a portion of a bottom surface of a connection groove 15h, a process for forming the second electrode 12a on an upper surface of the second semiconductor layer 15b, which is exposed by the insulating pattern 11 inside the connection groove 15h, and a process for forming the first electrode 10a on the first semiconductor layer 15a should have a sufficient margin, respectively. Therefore, the typical light-emitting element is formed such that a distance between a distal end of the first electrode 10a and a distal end of the second electrode 12a is at least 20 μm or more due to a distance A between the distal end of the first electrode 10a and an edge of the connection groove 15h, and a distance B between the distal end of the second electrode 12a and an edge of the bottom surface of the connection groove 15h.

FIG. 3A is a graph illustrating a driving voltage according to a distance between a first electrode and a second electrode, and FIG. 3B is a graph illustrating an optical output according to the distance between the first electrode and the second electrode. FIGS. 3A and 3B are graphs illustrating the results of Wafer #1 and Wafer #2 using a light-emitting element that emits blue light.

Specifically, as shown in FIG. 3A, as a distance between a distal end of a first electrode and a distal end of a second electrode is decreased, a driving voltage of the light-emitting element is reduced, and as the distance is increased, the driving voltage thereof is increased.

In addition, as shown in FIG. 3B, as a distance D between a distal end of a first electrode and a distal end of a second electrode is increased, resistance of the light-emitting element is increased as described above. That is, as the distance is widened, a current characteristic is deteriorated such that an optical output of the light-emitting element is reduced. Furthermore, when first and second semiconductor layers are each made of a material having high resistance, the driving voltage is significantly increased as a distance between the first and second electrodes is widened.

However, in the light-emitting element according to the embodiment of the present disclosure, when the distal end of the first electrode pattern 110a and the distal end of the contact electrode 120a are overlapped with each other, the distance between the distal end of the first electrode pattern 110a and the distal end of the contact electrode 120a becomes zero. Accordingly, the driving voltage can be reduced when compared to that of the typical light-emitting element such that the optical output can be improved.

Hereinafter, a light-emitting element according to another embodiment of the present disclosure will be described in detail with reference to the accompanying drawings.

FIG. 4A is a cross-sectional view of a light-emitting element according to another embodiment of the present disclosure, and FIG. 4B is an enlarged diagram of Area B in FIG. 4A. The light-emitting element according to another embodiment of the present disclosure differs from the embodiment of the present disclosure shown in FIGS. 1A and 1B only in structures of a first electrode, a second electrode, and an insulating pattern.

As shown in FIGS. 4A and 4B, the light-emitting element according to another embodiment of the present disclosure is configured such that a contact electrode 220a is formed only inside a connection groove 205h, and a first electrode pattern 210a extends inside the connection groove 205h, so that the first electrode pattern 210a and the contact electrode 220a are overlapped inside the connection groove 205h by interposing an insulating pattern 215 between the first electrode pattern 210a and the contact electrode 220a.

Specifically, the first electrode pattern 210a of a first electrode 210, which serves as a reflective layer, is disposed underneath a light-emitting structure 205 to come into contact with a first semiconductor layer 205a. At this point, a distal end of the first electrode pattern 210a extends to an inside of the connection groove 205h, so that an overlapped area between the first electrode pattern 210a and an active layer 205c expands. Thus, reflection efficiency is improved such that an optical output is improved. Although it is shown in the drawing that the distal end of the first electrode pattern 210a extends to a bottom surface of the connection groove 205h, the distal end of the first electrode pattern 210a may extend to only a side surface of the connection groove 205h.

A second electrode pattern 210b disposed underneath the first electrode pattern 210a to surround the first electrode pattern 210a may be formed of a material having superior electrical conductivity to allow a current injected from the outside to horizontally uniformly flow. Although the second electrode pattern 210b is shown as not being formed inside the connection groove 205h in the drawing, like the first electrode pattern 210a, the second electrode pattern 210b may be formed inside the connection groove 205h.

A second electrode 220 includes the contact electrode 220a in contact with a second semiconductor layer 205b inside the connection groove 205h, and a bonding electrode 220b configured to connect the contact electrodes 220a. The contact electrode 220a extends to an edge of the connection groove 205h and is formed only inside the connection groove 205h so as to surround the bottom surface and the side surface of the connection groove 205h. Further, the bonding electrode 220b is electrically connected to the contact electrode 220a and is entirely formed on a lower surface of the second electrode 220.

The insulating pattern 215 is disposed between the first electrode 210 and the second electrode 220 and electrically isolates the first electrode 210 from the second electrode 220. The insulating pattern 215 may include first, second, and third insulating patterns 215a, 215b, and 215c.

The first insulating pattern 215a is disposed between the light-emitting structure 205 and the contact electrode 220a on the side surface of the connection groove 205h. Accordingly, the contact electrode 220a and the active layer 205c, and the contact electrode 220a and the first semiconductor layer 205a may be insulated from each other through the first insulating pattern 215a. Further, the second insulating pattern 215b is disposed between the first electrode pattern 210a and the contact electrode 220a. Thus, the contact electrode 220a and the first electrode pattern 210a may be overlapped inside the connection groove 205h by interposing the second insulating pattern 215b between the contact electrode 220a and the first electrode pattern 210a.

The third insulating pattern 215c is disposed between the bonding electrode 220b and the first electrode 210 below the light-emitting structure 205. Accordingly, the second insulating pattern 215b and the third insulating pattern 215c expose the contact electrode 220a inside the connection groove 205h such that the contact electrode 220a and the bonding electrode 220b can be electrically connected to each other inside the connection groove 205h.

The light-emitting element according to another embodiment of the present disclosure is configured such that the first electrode pattern 210a of the first electrode 210, which is in contact with the first semiconductor layer 205a, and the contact electrode 220a of the second electrode 220, which is in contact with the second semiconductor layer 205b, are overlapped with each other inside the connection groove 205h by interposing the insulating pattern 215b between the first electrode pattern 210a and the contact electrode 220a. Accordingly, a distance between a distal end of the first electrode 210 and a distal end of the second electrode 220 becomes zero, and resistance of the light-emitting element is decreased such that a driving voltage of the light-emitting element is reduced.

Hereinafter, a manufacturing method of the light-emitting element according to the embodiment of the present disclosure will be described in detail with reference to the accompanying drawings.

FIGS. 5A to 5I are cross-sectional views illustrating processes of a manufacturing method of the light-emitting element according to the embodiment of the present disclosure.

As shown in FIG. 5A, the light-emitting structure 105 is formed on a base substrate 190. The light-emitting structure 105 may be divided into a plurality of structures when the support substrate, which will be described below, is cut. The base substrate 190 may be formed of a material selected from among a sapphire (Al2O3), SiC, GaAs, GaN, ZnO, Si, GaP, InP, Ge, and the like, but is not limited thereto. Specifically, the base substrate 190 is separated from the light-emitting structure 105 when the support substrate 125, which will be described below, is formed, and a separation layer 195 may be formed between the base substrate 190 and the light-emitting structure 105 to facilitate separation of the base substrate 190.

Specifically, the light-emitting structure 105 may be formed on the base substrate 190 using metal organic chemical vapor deposition (MOCVD), chemical vapor deposition (CVD), plasma-enhanced chemical vapor deposition (PECVD), molecular beam epitaxy (MBE), hydride vapor phase epitaxy (HVPE), sputtering, or the like, but the present disclosure is not limited thereto. The light-emitting structure 105 has a structure in which the second semiconductor layer 105b, the active layer 105c, and the first semiconductor layer 105a are sequentially stacked.

As shown in FIG. 5B, the first electrode pattern 110a and the first insulating pattern 115a are sequentially formed on the light-emitting structure 105, and the first electrode pattern 110a, the first insulating pattern 115a, and the light-emitting structure 105 are removed from a region at which the connection groove 105h will be formed, so that the connection groove 105h is formed to expose a portion of the second semiconductor layer 105b. Thus, a distal end of the first electrode pattern 110a and a distal end of the second insulating pattern 115b coincide with each other at an edge of the connection groove 105h.

Although two connection grooves 105h are shown in the drawing, the number of the connection grooves 105h is not limited thereto. The connection groove 105h includes a bottom surface exposing the second semiconductor layer 105b and a side surface exposing the first semiconductor layer 105a, the active layer 105c, and the second semiconductor layer 105b. Specifically, an inclined angle θ between the bottom surface and the side surface of the connection groove 105h may be in a range of 60° to 90° so as to prevent removal of an insulating material layer, which will be described below, from the side surface of the connection groove 105h.

The first electrode pattern 110a serves as a reflective layer configured to improve reflectance of light emitted from the active layer 105c. Further, the first insulating pattern 115a is provided to insulate the first electrode pattern 110a from the contact electrode 120a which will be described below.

As shown in FIG. 5C, the second insulating pattern 115b is formed on only the side surface of the connection groove 105h. The second insulating pattern 115b may be formed by forming an insulating material layer entirely on an upper surface of the light-emitting structure 105 to cover the connection groove 105h and removing the insulating material layer by dry etching. Specifically, when the insulating material layer is etched in a direction perpendicular to the upper surface of the light-emitting structure 105, the insulating material layer is removed from an upper surface of the first insulating pattern 115a and the bottom surface of the connection groove 105h and thus is left on only the side surface of the connection groove 105h such that the second insulating pattern 115b may be formed.

When the insulating material layer is removed, the insulating material layer on the side surface of the connection groove 105h may also be removed when the inclined angle θ between the bottom surface and the side surface of the connection groove 105h is less than 60°. Therefore, as described above, the inclined angle θ between the bottom surface and the side surface of the connection groove 105h may be in the range of 60° to 90°.

As shown in FIG. 5D, the contact electrode 120a is formed to be connected to the second semiconductor layer 105b which is exposed at the bottom surface of the connection groove 105h. At this point, the contact electrode 120a has a structure extending to the upper surface of the first insulating pattern 115a to be overlapped with the first electrode pattern 110a by interposing the first insulating pattern 115a between the first electrode pattern 110a and the contact electrode 120a.

Next, as shown in FIG. 5E, the second electrode pattern 110b is formed on the first electrode pattern 110a. Specifically, before the second electrode pattern 110b is formed, the first insulating pattern 115a of a region in which the second electrode pattern 110b will be formed is removed. Also, the first electrode pattern 110a may be further removed from a region in which an electrode pad, which will be described below, will be formed to expose the first semiconductor layer 105a so as to allow the electrode pad to be in direct contact with the second electrode pattern 110b. At this point, the removal of the first insulating pattern 115a and the first electrode pattern 110a may be performed by a photolithography process, but is not limited thereto.

Further, the second electrode pattern 110b is entirely formed on a surface of the first semiconductor layer 105a to cover the regions in which the first insulating pattern 115a and the first electrode pattern 110a are removed. The second electrode pattern 110b may be formed of a material having superior electrical conductivity so as to allow a current injected from the outside to horizontally uniformly flow. Specifically, although the second electrode pattern 110b is shown as being a single layer in the drawing, the second electrode pattern 110b may be formed of a single layer or a plurality of layers in which a TCO film is mixed with an opaque metal, but the second electrode pattern 110b is not limited thereto. The first electrode pattern 110a and the second electrode pattern 110b are respectively electrically connected to the first semiconductor layer 105a to serve as the first electrode 110.

As shown in FIG. 5f, the third insulating pattern 115c is entirely formed on the upper surface of the light-emitting structure 105 to cover the contact electrode 120a and the second electrode pattern 110b, and is selectively removed to expose a portion of the contact electrode 120a at the bottom surface of connection groove 105h. Therefore, the contact electrode 120a is partially exposed inside the connection groove 105h.

Next, as shown in FIG. 5G, the bonding electrode 120b is formed to be electrically connected to the exposed contact electrode 120a. The bonding electrode 120b connects the plurality of contact electrodes 120a. Although the bonding electrode 120b is shown as being a single layer in the drawing, the bonding electrode 120b may be formed with a single layer or a plurality of layers in which the TCO film and the opaque metal are mixed, but is not limited thereto. The contact electrode 120a and the bonding electrode 120b are respectively electrically connected to the second semiconductor layer 105b to serve as the second electrode 120. Further, the third insulating pattern 115c insulates the bonding electrode 120b from the second electrode 120.

Further, as shown in FIG. 5H, the support substrate 125 is formed to be electrically connected to the bonding electrode 120b. The support substrate 125 may be formed by bonding, plating, or deposition. Further, the base substrate 190 attached to the light-emitting structure 105 is removed. The base substrate 190 may be removed from the light-emitting structure 105 using laser lift-off. The laser lift-off may be performed by irradiating the base substrate 190 with an excimer laser. Thermal energy is concentrated at an interface between the base substrate 190 and the light-emitting structure 105 by the laser so that the base substrate 190 is separated from the separation layer 195. After the separation of the base substrate 190, the remaining separation layer 195 may be removed by an additional etching process.

Further, isolation etching may further be performed on the light-emitting structure 105. The isolation etching may be performed by dry etching such as inductively coupled plasma (ICP). A portion of the second electrode pattern 110b may be opened to the outside by the isolation etching. Further, the electrode pad 130 is formed on the exposed second electrode pattern 110b. The electrode pad 130 is electrically connected to the first electrode 110.

Subsequently, as shown in FIG. 5I, a roughness pattern may be formed on an upper surface of the second semiconductor layer 105b, and the protective layer 135 may be further formed to surround the light-emitting structure 105.

Hereinafter, a manufacturing method of the light-emitting element according to another embodiment of the present disclosure will be described.

FIGS. 6A to 6I are cross-sectional views illustrating processes of a manufacturing method of the light-emitting element according to another embodiment of the present disclosure.

As shown in FIG. 6A, the light-emitting structure 205 is formed on a base substrate 290, and the light-emitting structure 205 is selectively removed to form the connection groove 205h exposing a portion of the second semiconductor layer 205b. The method for forming the light-emitting structure 205 is the same as that described in FIG. 5A. Although two connection grooves 205h are shown in the drawing, the number of the connection grooves 205h is not limited thereto. Specifically, an inclined angle θ between the bottom surface and the side surface of the connection groove 205h may be in a range of 60° to 90° so as to prevent removal of an insulating material layer, which will be described below, from the side surface of the connection groove 205h.

Subsequently, as shown in FIG. 6B, the first insulating pattern 215a is formed on only the side surface of the connection groove 205h. Specifically, an insulating material layer is entirely formed on an upper surface of the light-emitting structure 205 to cover the connection groove 205h, and the insulating material layer is etched in a direction perpendicular to the upper surface of the light-emitting structure 205 by dry etching such that only the insulating material layer disposed on an upper surface of the first semiconductor layer 205a and the bottom surface of the connection groove 205h may be selectively removed. Accordingly, the insulating material layer is left on only the side surface of the connection groove 205h such that the first insulating pattern 215a is formed.

As shown in FIG. 6C, the contact electrode 220a is formed on the second semiconductor layer 105b which is exposed at the bottom surface of the connection groove 205h. The contact electrode 220a surrounds the bottom surface and the side surface of the connection groove 205h and is formed only inside the connection groove 205h. That is, the contact electrode 220a comes into direct contact with the second semiconductor layer 205b exposed at the bottom surface of the connection groove 205h, and exposes a portion of the first insulating pattern 215a at an edge of the connection groove 205h. This is to prevent a connection between the second electrode, which will be described below, and the contact electrode 220a at the edge of the connection groove 205h.

As shown in FIG. 6D, the second insulating pattern 215b is formed to cover the contact electrode 220a. The second insulating pattern 215b comes into contact with the first insulating pattern 215a exposed by the contact electrode 220a. That is, a distal end of the contact electrode 220a has a structure that is surrounded by the first insulating pattern 215a and the second insulating pattern 215b.

As shown in FIG. 6E, the first electrode pattern 210a is formed to expose a portion of the second insulating pattern 215b at the bottom surface of the connection groove 205h, and the second electrode pattern 210b is formed on the first electrode pattern 210a. The first electrode pattern 210a and the second electrode pattern 210b are respectively electrically connected to the first semiconductor layer 205a to serve as the first electrode 210.

Specifically, the distal end of the first electrode pattern 210a has a structure extending to an inside of the connection groove 205h. Although it is shown in the drawing that the distal end of the first electrode pattern 210a extends to the bottom surface of the connection groove 205h, the distal end of the first electrode pattern 210a may extend to only the side surface of the connection groove 205h. In addition, although the second electrode pattern 210b is shown as being not formed inside the connection groove 205h, like the first electrode pattern 210a, a distal end of the second electrode pattern 210b may extend to the inside of the connection groove 205h.

Further, as shown in FIG. 6F, the third insulating pattern 215c is entirely formed on a surface of the light-emitting structure 205 to cover the second insulating pattern 215b and the first electrode 210, and the second insulating pattern 215b and the third insulating pattern 215c are respectively selectively removed to expose a portion of the contact electrode 220a at the bottom surface of the connection groove 205h. Therefore, the contact electrode 220a is partially exposed inside the connection groove 205h.

Next, as shown in FIG. 6G, the bonding electrode 220b is formed to be electrically connected to the exposed contact electrode 220a. The bonding electrode 220b connects the plurality of contact electrodes 220a. The bonding electrode 220b may be electrically connected to the contact electrode 220a and may be entirely formed on an upper surface of the first electrode 210. The contact electrode 220a and the bonding electrode 220b are respectively electrically connected to the second semiconductor layer 205b to serve as the second electrode 220.

Further, as shown in FIG. 6H, a support substrate 225 is formed on the bonding electrode 220b. The support substrate 225 may be formed by bonding, plating, or deposition. Further, the base substrate 290 attached to the light-emitting structure 205 is removed. The base substrate 290 may be removed from the light-emitting structure 205 using laser lift-off. The laser lift-off may be performed by irradiating the base substrate 290 with an excimer laser. Thermal energy is concentrated at an interface between the base substrate 290 and the light-emitting structure 205 by the laser so that the base substrate 290 is separated from a separation layer 295. After the separation of the base substrate 290, the remaining separation layer 295 may be removed by an additional etching process.

Further, isolation etching may further be performed on the light-emitting structure 205. The isolation etching may be performed by dry etching such as inductively coupled plasma (ICP). A portion of the second electrode pattern 210b may be opened to the outside of the light-emitting structure 205 by the isolation etching. Further, an electrode pad 230 is formed on the exposed second electrode pattern 210b. The electrode pad 230 is electrically connected to the first electrode 210.

Subsequently, as shown in FIG. 6I, a roughness pattern may be formed on an upper surface of the second semiconductor layer 205b, and a protective layer 235 may be further formed to surround the light-emitting structure 205.

As described above, in the light-emitting element according to the embodiments of the present disclosure, overlapped areas between the first electrode patterns 110a and 210a serving as the reflective layer and the active layers 105c and 205c expand, and thus reflection efficiency is improved such that an optical output is improved. Also, contact areas between the contact electrodes 120a and 220a, which are each in direct contact with the second semiconductor layers 105b and 205b, and the second semiconductor layers 105b and 205b expand such that a driving voltage is reduced.

Further, the first electrode patterns 110a and 210a and the contact electrodes 120a and 220a are overlapped by interposing the insulating patterns 115 and 215 between the first electrode patterns 110a and 210a and the contact electrodes 120a and 220a, and thus distances between the distal ends of the first electrodes 110 and 210 and the distal ends of the second electrodes 120 and 220 become zero such that resistance of the light-emitting element is decreased and the driving voltage thereof is also reduced. Furthermore, when the light-emitting element according to the embodiments of the present disclosure is applied to UV-B and UV-C structures in which a semiconductor layer has high resistance, effects of reducing the driving voltage and improving the light efficiency can be further expected.

FIG. 7 is a cross-sectional view of a light-emitting element package including the light-emitting element according to the embodiment of the present disclosure.

As shown in FIG. 7, the light-emitting element package according to the embodiment of the present disclosure includes a body 15, a light-emitting element 100 formed on the body 15, a first lead frame 20a and a second lead frame 20b which are connected to the light-emitting element 100, and a molding portion 30 configured to surround the light-emitting element 100.

The body 15 may be formed of a silicone material, a synthetic resin material, or a metal material, but is not limited thereto. When the body 15 is made of a conductive material such as a metal, an insulating material may be further formed on a surface of the body 15 to prevent an electrical connection between the first lead frame 20a and the second lead frame 20b.

The light-emitting element 100 may be installed on the body 15, the first lead frame 20a, or the second lead frame 20b. In the drawing, the light-emitting element 100 is shown as being directly connected to the first lead frame 20a, and as being connected to the second lead frame 20b through a wire 25. In the light-emitting element 100 according to the embodiment of the present disclosure, the first lead frame 20a and a support substrate 300 may be electrically connected, and an electrode pad 400 may be electrically connected to the second lead frame 20b. Further, the molding portion 30 covers the light-emitting element 100. Although not shown in the drawing, the molding portion 30 may be configured to further include a fluorescent substance.

The light-emitting element package according to the embodiment may be configured to further include an optical member such as a light guide plate, a prism sheet, a diffusion sheet, and the like, and thus the light-emitting element package can serve as a backlight unit. Further, the light-emitting element according to the embodiments can be further applied to a display device, a lighting device, and a pointing device.

At this point, the display device may include a bottom cover, a reflector, a light-emitting module, a light guide plate, an optical sheet, a display panel, an image signal output circuit, and a color filter. The bottom cover, the reflector, the light-emitting module, the light guide plate, and the optical sheet may configure a backlight unit.

The reflector is disposed on the bottom cover, and the light-emitting module emits light. The light guide plate is disposed in front of the reflector to guide the light emitted from the light-emitting module to a front side, and the optical sheet includes a prism sheet and the like and is disposed in front of the light guide plate. The display panel is disposed in front of the optical sheet, the image signal output circuit supplies an image signal to the display panel, and the color filter is disposed in front of the display panel.

Further, the lighting device may include a light source module including a substrate and the light-emitting element according to the embodiments, a heat dissipation portion configured to dissipate heat of the light source module, and a power suppler configured to process or convert an electric signal provided from the outside to provide the electrical signal to the light source module. Further, the lighting device may include a lamp, a head lamp, a street lamp, or the like.

It should be understood that embodiments of the present disclosure are not limited to the above described embodiments and the accompanying drawings, and various changes, substitutions and alterations can be devised by those skilled in the art that without departing from the technical spirit of the embodiment described herein.

The invention claimed is:

1. A light-emitting element comprising:
   a support substrate;
   a light-emitting structure disposed on the support substrate and including a first conductive semiconductor layer, an active layer, and a second conductive semiconductor layer;

a plurality of connection grooves penetrating the first conductive semiconductor layer, the active layer and a portion of the second conductive semiconductor layer, and including a top surface exposing the second conductive semiconductor layer and a side surface exposing the first conductive semiconductor layer, the active layer, and the portion of the second conductive semiconductor layer;

a first electrode disposed at a bottom surface of the light-emitting structure to be in contact with the first conductive semiconductor layer, and including a first electrode pattern having a distal end extending to an edge of each of the plurality of connection grooves, and a second electrode pattern disposed at a lower portion of the first electrode pattern;

a second electrode including a contact electrode disposed in the plurality of connection grooves to contact to the second conductive semiconductor layer and a bonding electrode connected to the contact electrode; and an insulating pattern disposed between the first electrode and the second electrode, wherein the support substrate is electrically connected to the second electrode, and wherein the contact electrode extends from the plurality of connection grooves to the bottom surface of the light-emitting structure.

2. The light-emitting element of claim 1, wherein the insulating pattern includes:
   a first insulating pattern disposed between the contact electrode and the first electrode pattern;
   a second insulating pattern disposed between the contact electrode and the first electrode pattern at the side surface of each of the plurality of connection grooves; and
   a third insulating pattern disposed between the bonding electrode and the second electrode pattern on the light-emitting structure.

3. The light-emitting element of claim 2, wherein the contact electrode overlaps with the first electrode pattern in a vertical direction of the light-emitting structure.

4. The light-emitting element of claim 2, wherein each of the first electrode pattern and the first insulating pattern is in contact with the second insulating pattern at an edge of each of the plurality of connection grooves.

5. The light-emitting element of claim 2, wherein the second insulating pattern insulates the contact electrode from the first electrode pattern, the contact electrode from the active layer, and the contact electrode from the first conductive semiconductor layer.

6. The light-emitting element of claim 2, wherein the third insulating pattern exposes the contact electrode in an inside of each of the plurality of connection grooves such that the contact electrode and the bonding electrode are electrically connected inside the connection groove.

7. The light-emitting element of claim 2, wherein the third insulating pattern exposes the contact electrode in an inside of each of the plurality of connection grooves and is entirely disposed on a lower surface of the first electrode.

8. The light-emitting element of claim 1, wherein an inclined angle between the side surface and the top surface of each of the plurality of connection grooves is in a range of 60° and 90°.

9. The light-emitting element of claim 1, wherein the first electrode pattern is a reflective layer configured to reflect light generated in the active layer to the second conductive semiconductor layer.

10. A light-emitting element comprising:
a support substrate;
a light-emitting structure disposed on the support substrate and including a first conductive semiconductor layer, an active layer, and a second conductive semiconductor layer;
a plurality of connection grooves penetrating the first conductive semiconductor layer, the active layer and a portion of the second conductive semiconductor layer, and including a top surface exposing the second conductive semiconductor layer and a side surface exposing the first conductive semiconductor layer, the active layer, and the portion of the second conductive semiconductor layer;
a first electrode disposed at a bottom surface of the light-emitting structure to be in contact with the first conductive semiconductor layer, and including a first electrode pattern having a distal end extending to an edge of each of the plurality of connection grooves, and a second electrode pattern disposed at a lower portion of the first electrode pattern;
a second electrode including a contact electrode disposed in the plurality of connection grooves to contact to the second conductive semiconductor layer and a bonding electrode connected to the contact electrode; and
an insulating pattern disposed between the first electrode and the second electrode,
wherein the support substrate is electrically connected to the second electrode, and
wherein the first electrode pattern extends from the bottom surface of the light-emitting structure into the plurality of connection grooves.

11. The light-emitting element of claim 10, wherein the first electrode pattern and the contact electrode are overlapped at an inside of each of the plurality of connection grooves by interposing the insulating pattern between the first electrode pattern and the contact electrode.

12. The light-emitting element of claim 10, wherein the insulating pattern includes:
   a first insulating pattern disposed between the light-emitting structure and the contact electrode on the side surface of each of the plurality of connection grooves;
   a second insulating pattern disposed between the first electrode pattern and the contact electrode; and
   a third insulating pattern disposed between the bonding electrode and the first electrode on the light-emitting structure.

13. The light-emitting element of claim 12, wherein the first insulating pattern insulates the contact electrode from the active layer, and the contact electrode from the first conductive semiconductor layer.

14. The light-emitting element of claim 12, wherein a distal end of the contact electrode is surrounded by the first insulating pattern and the second insulating pattern at the edge of each of the plurality of connection grooves.

15. The light-emitting element of claim 12, wherein the second insulating pattern and the third insulating pattern expose the contact electrode on the top surface of each of the plurality of connection grooves such that the contact electrode and the bonding electrode are electrically connected inside the connection groove.

16. The light-emitting element of claim 12, wherein the third insulating pattern exposes the contact electrode in an inside of each of the plurality of connection grooves and is entirely disposed on a lower surface of the first electrode.

17. The light-emitting element of claim 10, wherein an inclined angle between the side surface and the top surface of each of the plurality of connection grooves is in a range of 60° and 90°.

18. The light-emitting element of claim 10, wherein the first electrode pattern is a reflective layer configured to reflect light generated in the active layer to the second conductive semiconductor layer.

* * * * *